(12) United States Patent
Gattuso et al.

(10) Patent No.: US 7,161,805 B2
(45) Date of Patent: Jan. 9, 2007

(54) LATCH MEANS FOR SOCKET CONNECTOR ASSEMBLY

(75) Inventors: Andrew Gattuso, Phoenix, AZ (US); Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 425 days.

(21) Appl. No.: 10/691,803

(22) Filed: Oct. 21, 2003

(65) Prior Publication Data

US 2005/0083659 A1    Apr. 21, 2005

(51) Int. Cl.
*H05K 7/20* (2006.01)

(52) U.S. Cl. ..................... 361/704; 439/342

(58) Field of Classification Search ............ 361/704, 361/695; 439/330, 331, 73, 266, 342
See application file for complete search history.

(56) References Cited

U.S. PATENT DOCUMENTS

| 5,320,550 | A | 6/1994 | Uratsuji et al. |
| 5,364,286 | A | 11/1994 | Matsuoka |
| 5,669,780 | A | 9/1997 | Fukunaga |
| 5,854,738 | A | 12/1998 | Bowler |
| 6,449,157 | B1 | 9/2002 | Chu |
| 6,466,443 | B1 | 10/2002 | Chen |

*Primary Examiner*—Javaid H. Nasri
(74) *Attorney, Agent, or Firm*—Wei Te Chung (57) ABSTRACT

The socket connector assembly (20) comprises a socket connector (30), an IC package (40) installed upon the socket connector, a heat sink (60) mounted above the IC package, an actuator (50, 50') detachably attached to the socket connector, a retention mechanism (70) mounted on the actuator and securing the heat sink on the actuator, and at least one latch (51, 51'). The at least one latch comprises a body (51a, 51a'). One end (51c) of the body is disposed on a part of the actuator. A latching portion (51b, 51b') is formed on another end of the body, for being directly attached to a part of the socket connector. Thus the at least one latch holds the actuator on the socket connector.

16 Claims, 6 Drawing Sheets

LATCH MEANS FOR SOCKET CONNECTOR ASSEMBLY

BACKGROUND OF THE INVENTION

1. Field of the Invention

The present invention relates to the art of electrical connector assemblies, and more particularly to latch means incorporated in a socket connector assembly having two electrically interconnecting interfaces, such as a printed circuit board (PCB) and an integrated circuit (IC) package.

2. Description of the Prior Art

Generally, an actuator is provided for securing package of an IC package, and a hest sink if any, on an electrical connector, specially a land grid array (LGA) type socket connector. The actuator comprises a bracket-like frame with a plurality of retention legs. A plurality of holes is defined in a PCB, for engaging corresponding retention legs. The actuator is held on the PCB and the IC package is secured on the socket connector. Reliably electrical engagement between the IC package and the PCB is thereby attained. However, during manufacturing the PCB, the holes are prone to bring inconvenience or trouble in laying out of electrical circuit paths in the PCB. Furthermore, the frame occupies relatively large real estate on the PCB.

Figure 10:
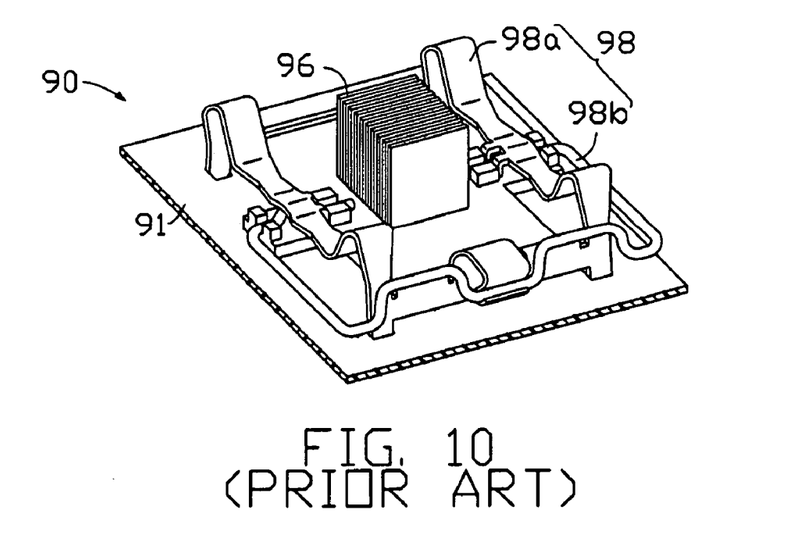
FIG. 10 is an assembled, isometric view of a conventional socket connector assembly.
Figure 11:
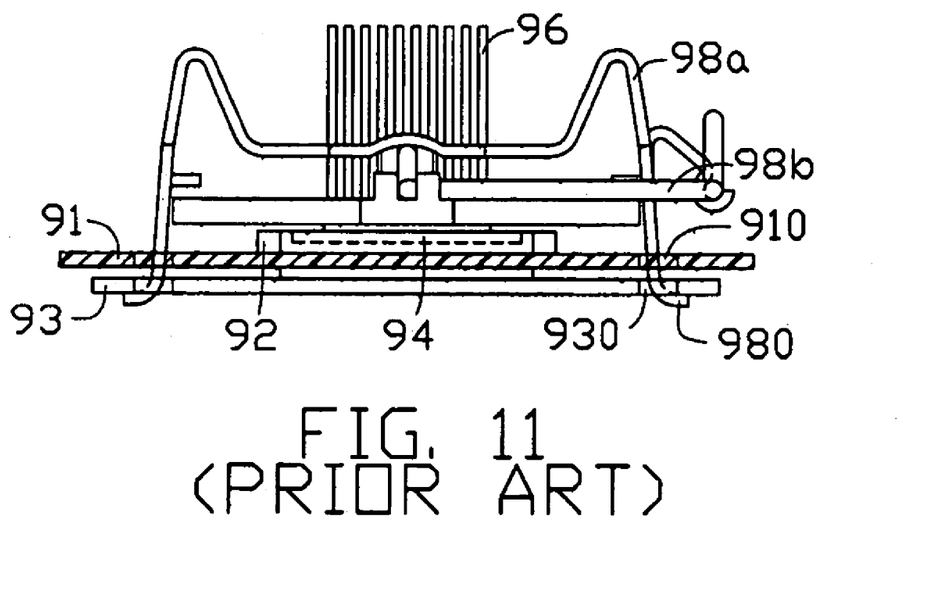
FIG. 11 is a left view of the socket connector assembly of FIG. 10.

Specially, referring to FIGS. 10 and 11, a socket connector assembly 90 comprises a socket connector 92, a CPU 94 received in the socket connector 92, a heat sink 96 mounted on the CPU 94, an actuator 98 for securing the heat sink 96 and the CPU 94 on the socket connector 92, a PCB 91 for mounting the socket connector 92, and a retention board 93 for strengthening the PCB 91. The actuator 98 comprises a frame 98a mounted on the PCB 91. Four retention legs 980 symmetrically extend downwardly from four corners of the frame 98a, respectively. Four through holes 910 are defined in the PCB 91, corresponding to the retention legs 980 of the frame 98a. Four retention holes 930 are defined in the retention board, each retention hole 930 aligning with a corresponding through holes 910. The retention legs 980 extend through the through holes 910 and the retention holes 930 and snaps on a bottom surface of the retention board 93. Thereby the actuator 98 is held on the retention board 93 and the socket connector assembly 90 is secured together.

However, the through holes 910 render a layout of circuit paths in the PCB 91 inconvenient. Furthermore, the frame 98a has a configuration occupying relatively large real estate on the PCB 91. U.S. Pat. Nos. 6,466,443, 6,449,157 and 5,854,738 each have similar shortcomings as stated above.

Accordingly, a new socket connector assembly that solves the above problems is desirable.

SUMMARY OF THE INVENTION

Accordingly, an object of the present invention is to provide a socket connector assembly furnished with latch means able to directly and conveniently mount an actuator of the socket connector assembly on a socket connector of the socket connector assembly.

To fulfill the above object, a socket connector assembly is applied according to the present invention. The socket connector assembly comprises a socket connector, an IC package mounted upon the socket connector, a heat sink mounted above the IC package, an actuator detachably attached to the socket connector, a retention mechanism mounted on the actuator and adapted to secure the heat sink on the actuator, and at least one latch. Said at least one latch comprises a body. One end of the body is disposed on a part of the actuator. A latching portion is formed on another end of the body, for being directly attached to a part of the socket connector. Thus said at least one latch holds the actuator on the socket connector.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
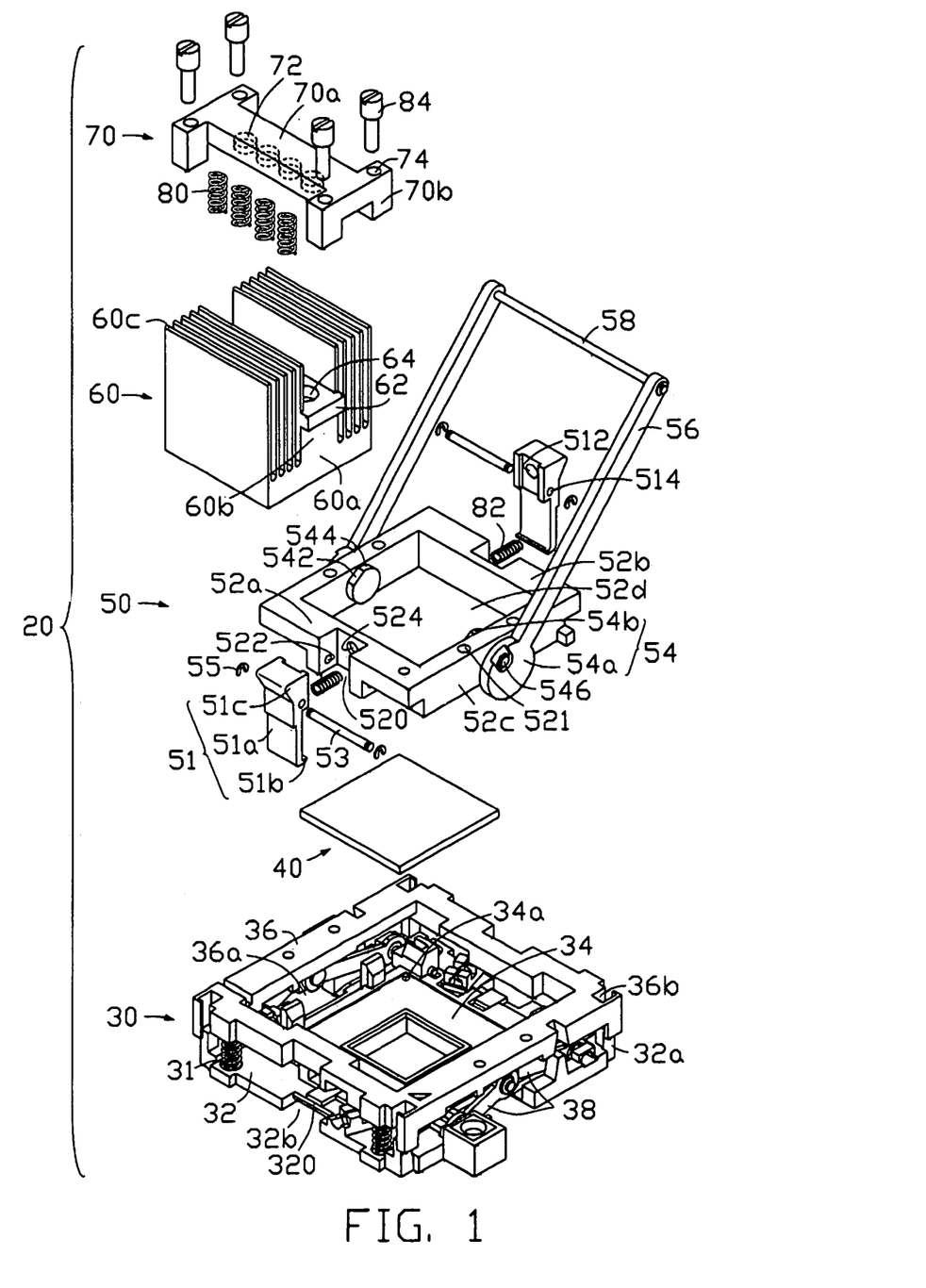
FIG. 1 is an exploded, isometric view of a socket connector assembly according to the present invention.

Referring to FIG. 1, there is shown an exploded, isometric view of a socket connector assembly 20. The socket connector assembly 20 is mainly applied for testing an IC package, such as a CPU 40, through a test board (not shown). The socket connector assembly 20 comprises a socket connector 30 and an actuator 50 detachably mounted on the socket connector 30.

The socket connector 30 comprises a substantially parallelepiped base 32 receiving a plurality of terminals (not shown), and a plate-like cover 34 slidably mounted on the base 32, and a rectangular lid 36 movably attached to the base 32 via transmitting members 38, and coil springs 31 disposed between the lid 36 and the base 32.

The base 32 is molded from dielectric material, such as liquid crystal polymer (LCP), and has a mounting surface (not labeled) mounted on the test PCB. An array of passages (not shown) is defined around a center of the base 32, the passages receiving corresponding terminals. Four guiding posts 32a extend upwardly from four corners of the base 32, respectively. A recess (not labeled) is defined in a top surface of the base 32 adjacent each post 32a, for receiving a part of a corresponding coil spring 31. Further, an opening 32b is defined in a middle of each of opposite edges of the base 32.

A latching tongue 320 extends horizontally outwardly from an inner side of the opening 32b, but remains in the opening 32b.

The cover 34 is formed from dielectric material, such as liquid crystal polymer (LCP). The cover 34 has a mating surface (not shown) mounted on the base 32, with latches of the cover 34 engaging in slots of the base 32 (not shown). An array of holes 34a is defined around a center of the cover 34, each hole 34a being aligned with a corresponding passage. The holes 34a are adapted to accommodate and urge conductive members (not shown) of the CPU 40, respectively. The cover 34 is horizontally slidable relative to the base 32, between a first horizontal open position, where the conductive members of the CPU 40 disengage corresponding terminals, and a second horizontal close position, where the conductive members of the CPU 40 engage the terminals.

The lid 36 is formed from metal material or high density material, and defines rectangular cavity 36a at a center thereof. Four guiding channels 36b are defined in four corners of the lid 36, corresponding to the guiding posts 32a of the base 32. The guiding channels 36b and the guiding posts 32a cooperatively facilitate guidance of vertical movement of the lid 36 relative to the base 32.

The actuator 50 is formed from metal material or high density material, and is used to urge the lid 36 so as to drive the cover 34 via the transmitting members 38 to move relative to the base 32 from the open position to the close position. The actuator 50 has a rectangular frame 52 comprising a front wall 52a, a back wall 52b, two side walls 52c spanning between the front wall 52a and the back wall 52b. All these walls cooperatively define a rectangular through opening 52d. Two spaced screw holes 521 are defined in a top surface of each side wall 52c.

A pair of twin urging members 54 is respectively rotatably attached to the side walls 52c, preferably to middles of the side walls 52c. Each twin urging member 54 is provided with a common shaft 546. The common shaft 546 is adapted to engage in a positioning hole (not shown) of a corresponding side wall 52c, thereby locating the twin urging member 54 on the frame 52.

Each twin urging member 54 comprises a large cam 54a and a small cam 54b. Preferably, the large cam 54a has a circle configuration. The small cam 54b has a circle configuration with part thereof cut so that it comprises a curved surface 544 and a planar surface 542.

A pair of actuating levers 56 is integrally connected to edges of the large cams 54a, for facilitate driving the twin urging members 54. A cross handle 58 is disposed between two free ends of the pair of actuating levers 56, for being conveniently held by a user during driving.

A pair of rectangular accommodating openings 520 is defined outwardly in middles of the front and back walls 52a, 52b of the frame 52, respectively. A pair of bores 522 is defined in opposite sides of each opening 520, through the sides. A receiving recess 524 is defined in an inner side of each opening 520.

Figure 2:
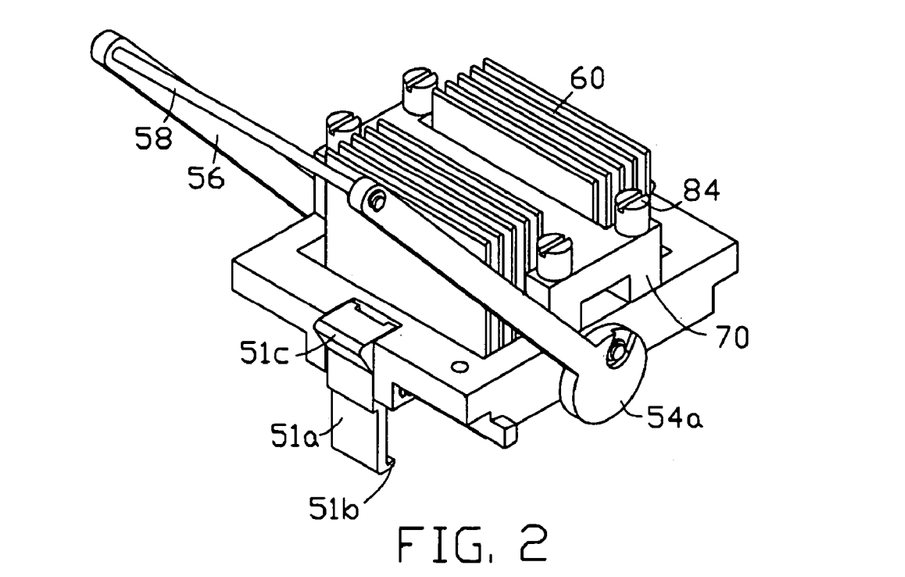
FIG. 2 is an assembled, isometric view of an actuator of the socket connector assembly securing a heat sink of the socket connector assembly via a retention mechanism, and a pair of latches attached to a frame of the actuator.
Figure 3:
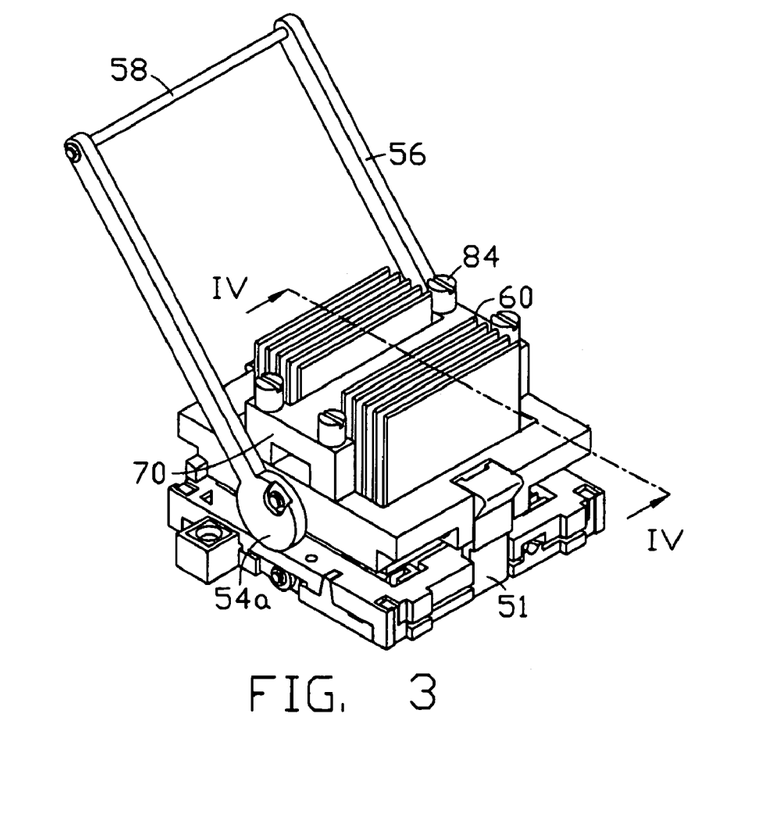
FIG. 3 is an assembled, isometric view of the socket connector assembly of FIG. 1.

Referring also to FIGS. 2 and 3, a pair of latches 51 is respectively attached to the frame 52, for holding the actuator 50 on the base of the socket connector 30. Each latch 51 comprises a step-like body 51a. A hook-like leg 51b is formed at a distal end of the body 51a, for holding on a correspond tongue 320 of the base 32 of the socket connector 30. A head 51c is formed at a top end of the body 51a and has an enlarged configuration for being conveniently held. A pair of flanks (not labeled) extends outwardly from opposite sides of a front surface of the head 51c. An accommodating recess 512 is defined in the front surface of the head 51c, between the flanks. A through bore 514 is transversely defined in a cross portion between the head 51c and the body 51a.

The latch 51 is pivotally attached to the front wall 52a of the frame 52, a pivotal shaft 53 extending through the accommodating recess 512 of the latch and corresponding pair of bores 522 of the frame 52. Additional, a pair of washers 55 is disposed at opposite ends of the pivotal shaft 53, thereby securing the pivotal shaft 53 in the accommodating recess 512 and the pair of bores 522. Thus, the latch 51 is firmly attached to the frame 52.

Figure 4:
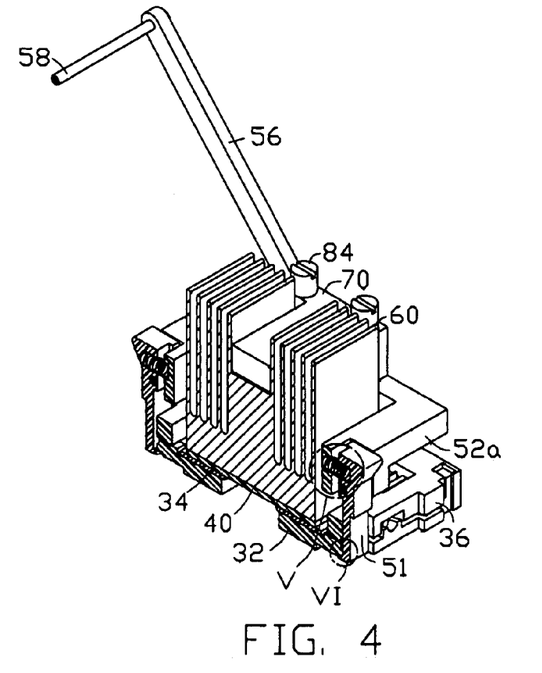
FIG. 4 is similar to FIG. 3, but showing a part of the socket connector assembly cut away along line IV—IV of FIG. 3.
Figure 5:
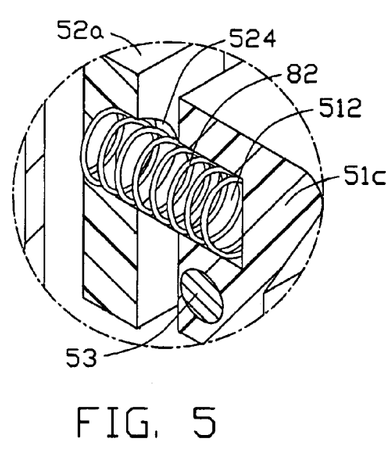
FIG. 5 is an enlarged view of a circled portion V of FIG. 4.
Figure 6:
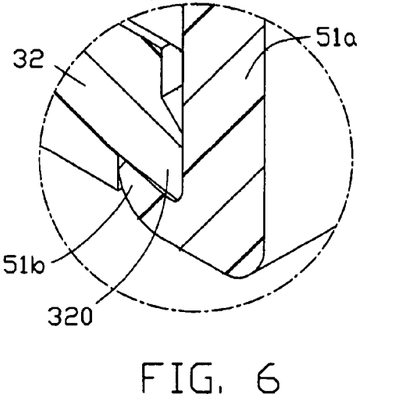
FIG. 6 is an enlarged view of a circled portion VI of FIG. 4.

Referring to FIGS. 4, 5 and 6, in order to assure holding of the leg 51b on the tongue 320, a urging spring 82 is provided in the receiving recess 524 of the frame 52 and the accommodating recess 512 of the latch 51. When the leg 51b holds on the tongue 320, the urging spring is compressed, thereby supplying elastic force. Said elastic force urges the head 51c to rotate round an axis of the shaft 53, thereby latching the leg 51b on the tongue 320.

Furthermore, in order to dissipate heat generated from the CPU 40, a heat sink 60 is applied to mount on the CPU 40 during testing. Additionally, a retention member 70 is applied to secure the heat sink 60 on the actuator 50.

Referring back to FIG. 1, the heat sink 60 is formed from metal material, and comprises a block-like bottom portion 60a for absorbing heat. A block-like protrusion 60b extends upwardly from a middle of a top surface of the bottom portion 60a. A pair of ear portions 62 extends outwardly from tops of opposite sides of the protrusion 60b. Four receiving apertures 64 are defined upwardly in a top surface of the protrusion 62b. A plurality of fin-like dissipating-heat plates 60c extends upwardly from the top surface of the bottom portion 60a, the plates 60c being disposed at opposite sides of the protrusion 60b.

The retention member 70 has a body 70a, four legs 70b disposed at four corners of the body 70a. Four receptacles 72 are defined downwardly in a bottom surface of the body 70a, corresponding to the receiving apertures 64 of the heat sink 60. A through hole 74 is defined through each leg 70b, aligning with a corresponding screw holes 521 of the frame 52.

After assembly of the socket connector 30, the coil springs 31 cooperatively lift the cover 34 to a topmost position, the open position. The CPU 40 is placed on a top surface of the cover 34, the conductive members of the CPU 40 extending through corresponding holes 34a of the cover 34 and corresponding passages of the base 32.

The heat sink 40 is received in the through opening 52d of the frame 52, the curved surfaces 542 of the small cams 54b supporting corresponding ear portions 62 of the heat sink 60. Four pressing springs 80 is placed in the receiving apertures 64 of the heat sink 60. The retention member 70 is placed down, the receptacles 72 aligning with the pressing springs 80. Four screws 84 are applied to extend through the through holes 74 of the legs 70b of the retention member 70 and engage the screw holes 521 of the frame 50. The pressing springs 80 is restricted and compressed in the receptacles 72 and the receiving apertures 64, thereby generating elastics force. Said elastic force assures that the ear portions 62 presses on the curved surfaces 542 of the small cams 54b. The heat sink 60 is thereby attached to the actuator 50.

Figures 7, 8:
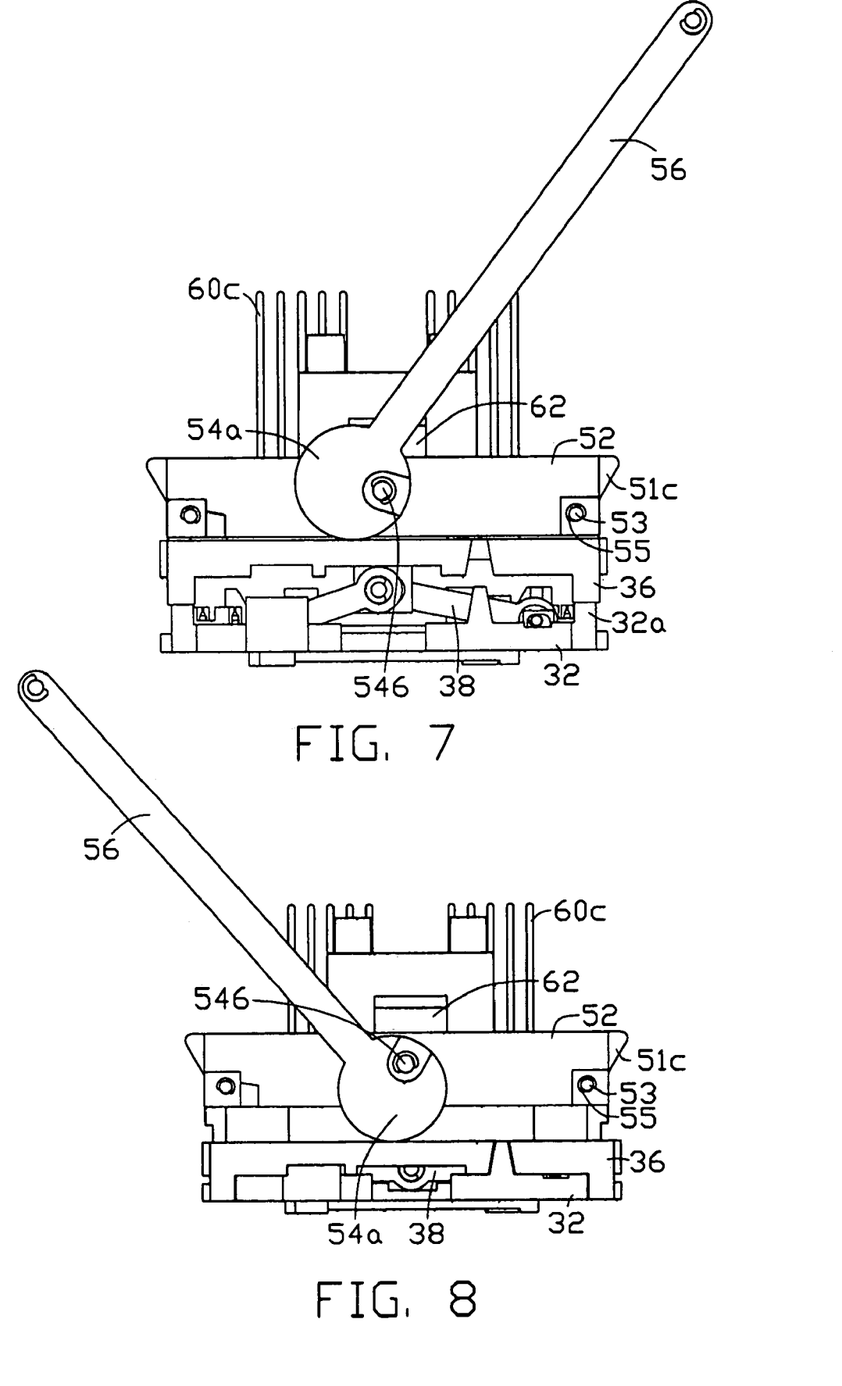
FIG. 7 is a right view of the assembled socket connector assembly of FIG. 3, but showing the actuator at an open position.
FIG. 8 is similar to FIG. 7, but showing the actuator at a close position.

Referring again to FIGS. 4, 5 and 6, the heads 51c of the latches 51 is pressed inwardly to rotate the legs 51b outwardly around the shafts 53 until the legs 51b rides over the tongues 320 of the base 32. The heads 51c is released to resile back and hold on the tongues 320. The socket connector assembly 20 is thereby assembled together. Referring to FIGS. 1 and 7, each large cam 54a touches on a top surface of a corresponding side wall 52c of the frame 52, touching point of the large cam 54a on the top surface is substantially the furthest away from the axis of the shaft 546 of the small cam 54b. Meanwhile, since the curves 544 of the small cams 54b supports the ear portions 62 of the heat sink 60, and supporting point (not shown) of each small cam 54b on a corresponding ear portion 62 is the furthest away from the axis of the shaft 546 of the small cam 54b. Thus, the heat sink 60 is the furthest away from the CPU 40, and is prevented from touching on the CPU 40 in or just after assembling.

Referring to FIGS. 1, 7 and 8, in use, the cross handle 58 is urged to drive the large cam 54a to rotate round the shaft 546 of the small cam 54b. Touching point of the large cam 54a on the top surface is more and more near to the axis of the shaft of the small cam 54b. Until touching point of the large cam 54a on the top surface is substantially the nearest to the axis of the shaft of the small cam 54b, the large cams 54a press the lid 36 move down to the second horizontal position. The lid 36 urges the transmitting member 38 to rotate, thereby driving the cover 34 to horizontally move relative to the base 32 until the close position. The conductive members of the CPU 40 electrically mate with corresponding terminals. Simultaneously, the planar surfaces 542 of the small cams 54B support the ear portions 62 of the heat sink 60, thereby the heat sink 60 moves down to touch a top surface of the CPU 40. This facilitates dissipating heat generated from the CPU 40 during testing. Said planar engagement between the planar surfaces 542 and the ear portions 62 prevents the small cams 54b from moving backward or forward. The cover is steadily oriented at the close position. Thus, the CPU 40 is safely tested via the socket connector 30.

After testing, a disassembly process is needed to pick the CPU 40 up. The cross handle 58 is urged to drive the large cams 54a and the small cams 54b to rotate round the shafts of the small cams 54b. The coil springs 31 lift the lid 36. The lid 36 brings the transmitting member 38 to rotate. The transmitting members 38 drive the cover 34 to move relative to the base 32 until the open position. Simultaneously, the curved surfaces 544 of the small cams 54b lift the heat sink 60 up, thereby divorcing the heat sink 60 from the top surface of the CPU 40. Then the heads 51c of the latches 51 are pressed inwardly to rotate the legs 51b outwardly around the shafts 53 until the legs 51b disengage the tongues 320 of the base 32. The actuator 50 is lifted up from the socket connector 30, together with the heat sink 60. The CPU 40 is safely picked up from the socket connector 30.

Although in the first embodiment of the present invention the latches 51 are detachably attached to the frame 52. It should be understood that the configuration of the latch 51 may be varied to meet different factual requirements, provided that the latches 51 attached to the actuator 50 directly latch the socket connector 30.

Figure 9:
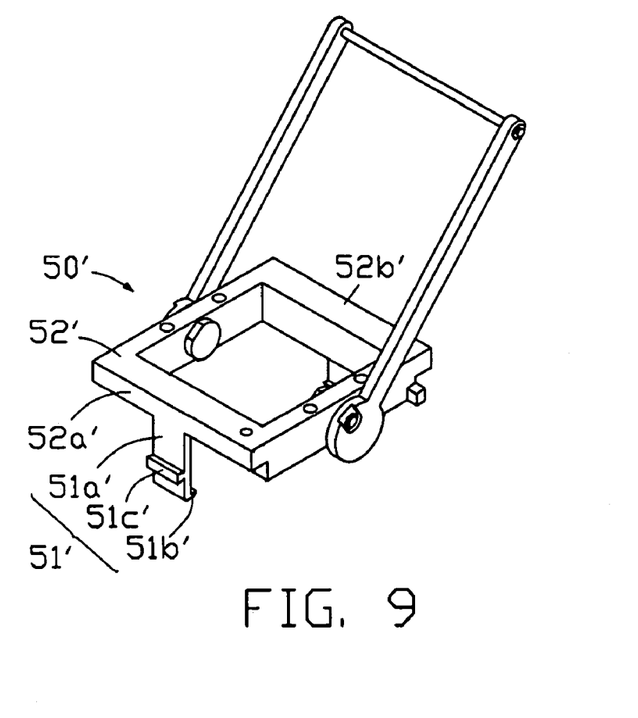
FIG. 9 is an isometric view of another actuator according to a second embodiment of the present invention.

FIG. 9 shows another latch 51' according to a second embodiment of the present invention. A pair of the latches 51' is integrally formed on middles of the front walls 52a' and the back walls 52b' of the frame 52', respectively. Each latch 51' comprises a resilient portion 51a'. An upper end of the resilient portion 51a' is integrally formed on a corresponding middle of the frame 52'. A hook 51b' is formed at a distal end of the resilient portion 51a', for holding on a corresponding tongue 320 of the base 32. A handle protrusion 51c' projects outwardly from an outside surface of the resilient portion 51a'. Preferably, the handle protrusion 51c' is disposed adjacent the hook 51b', for facilitating being pulled.

Referring also to FIG. 1, except for the actuator 50, in assembly, the handle protrusion 51c' is pulled outwardly. The resilient portion 51a' deforms and the hook 51b' rides over the tongue 320 of the base 32. Then the handle protrusion 51c' is released and the resilient portion 51a' resiles back. The hook 51b' holds on the tongue, thereby attaining the same latching function as the latch 51 as described in the first embodiment. In disassembling, the handle protrusion 51c' facilitates being pulled outwardly. Said pulling action deforms the resilient portion 51a'. Once the hooks 51b' disengage the tongues 320 of the base 32, the actuator 50' is lifted up from the socket connector 30, together with the heat sink 60. The CPU 40 is safely picked up from the socket connector 30.

Although in the preferred alternative embodiments of the present invention the latches 51, 51' hold on the tongues 320 of the base 32. It should be appreciated that the latches 51, 51' may directly hold on other parts of the base 32, such as a bottom surface of the base 32, provided said holding does not have any side effect on mounting the socket connector 30 on the test board.

Furthermore, although the present invention has been described with reference to particular embodiments, it is not to be construed as being limited thereto. Various alterations and modifications can be made to the embodiments without in any way departing from the scope or spirit of the present invention as defined in the appended claims. For example, the cooperation of the lever 56 and the cam 54a, 54b could be replace by the linearly moveable device or wedged device to urge the lid 36 downwardly rather than other rotatable devices.

What is claimed is:

1. An electrical connector assembly comprising:
   an electrical connector for holding an IC package with a plurality of conductive members, the electrical connector comprising a base receiving a plurality of terminals for engaging corresponding conductive members;
   an actuator mounted on the electrical connector and comprising a frame; and
   at least one latch comprising a body, the body provided on the frame and having a latching portion to hold on the base so as to hold the actuator on the electrical connector together; wherein
   the frame defines an opening and bores at opposite sides of the opening, the body defines a through hole corresponding to the bores.

2. The electrical connector assembly of claim 1, wherein the body is pivotally disposed on the frame, the latching portion is formed at one end of the body.

3. The electrical connector assembly of claim 1, wherein the actuator further comprises a spring member and a shaft, the frame defines a receiving recess in an inner side of the opening, the body defines a accommodating recess corresponding to the receiving recess, the receiving recess and the accommodating recess cooperatively receive and compress the spring member, the through hole and the bores cooperatively receive the shaft so as to pivotally attach said at least one latch to the frame.

4. The electrical connector assembly of claim 1, wherein the body is integrally disposed on the frame, the latching portion is formed at one end of the body.

5. The electrical connector assembly of claim 4, wherein the body is resiliently movable relative to the frame and forms a handle portion on a side thereof.

6. The electrical connector assembly of claim 1, wherein the base defines a cutout at one edge thereof and forms an engaging portion in the cutout.

7. The electrical connector assembly of claim 1, wherein the electrical connector further comprises a cover slidably mounted on the base, a lid movably attached to the base, transmitting members movably attached to the base and the lid and adapted for transmitting a force acted on the lid to the cover to urge the cover to slide relative to the base from a first position to a second position, and spring members disposed on the base and the lid and adapted for urging the lid to drive the cover to slide relative to the base from the second position to the first position via said transmitting members.

8. The electrical connector assembly of claim 1, wherein the actuator further comprises a twin urging member rotatably installed on the frame, said twin urging member comprises a large cam and a small cam with a common shaft immovably connected to the large cam.

9. The electrical connector assembly of claim 8, wherein the large cam is provided with an urging lever connected to an edge thereof and the small cam comprises a planar edge surface and a curve edge surface.

10. An electrical connector assembly comprising:
an electrical connector comprising a base, a cover horizontally slidably mourned on the base, and a lid vertically movably held on the base and urging the cover to move relative to the base between a first position and a second position;
an actuator mounted on the electrical connector and urging the lid to drive the cover to move relative to the base between the first position and the second position; and
said actuator assembled to the housing;
at least one latch having one end disposed on the actuator and another end forming a latching portion adapted to hold on the base of the electrical connector, thereby holding the actuator on the electrical connector,
wherein the one end of the body is pivotally disposed on the actuator,
wherein the actuator comprises a frame, the frame defines an opening and bores at opposite sides of the opening, the one end of the body defines a through hole corresponding to the bores.

11. The electrical connector assembly of claim 10, wherein the actuator further comprises a spring member and a shaft, the frame defines a receiving recess in an inner side of the opening and the one end of the body defines an accommodating recess corresponding to the receiving recess, the receiving recess and the accommodating recess cooperatively receive and compress the spring member, the through hole and the bores cooperatively receive the shaft so as to pivotally attach the at least one latch to the frame.

12. The electrical connector assembly of claim 10, wherein the one end of body is integrally disposed on the actuator.

13. The electrical connector assembly of claim 12, wherein the body is resiliently movable relative to the frame and forms a handle portion on a side thereof.

14. The electrical connector assembly of claim 10, wherein the base defines a cutout at one edge thereof, and an engaging portion in the cutout.

15. An electrical connector assembly comprising:
an electrical connector comprising a base receiving a plurality of terminals, a lid vertically movably attached to the base, a cover horizontally movably attached to the base, and a transmitting system provided between the lid and the cover to convert a vertical movement of the lid to a horizontal movement of the cover;
an IC package installed upon the cover of the electrical connector, the IC package having a plurality of conductive members for engaging corresponding terminals;
a heat sink mounted above the IC package;
an actuator positioned upon the lid; and
a retention mechanism mounted on the actuator and equipped with a resiliency device to urge the heat sink toward and further to tightly abut against the IC package;
the actuator releasably latched to the base so as to hold the actuator on the electrical connector; wherein
said actuator actuates the lid to move the cover via said transmission system.

16. The assembly of claim 15, wherein said connector includes at least one spring to urge the lid upwardly away from the base while said actuator includes a moveable urging device to urge the lid downwardly toward the base for resisting said spring.

* * * * *